US007940281B2

(12) United States Patent
Wang et al.

(10) Patent No.: US 7,940,281 B2
(45) Date of Patent: May 10, 2011

(54) DITHERING METHOD AND RELATED DITHERING MODULE AND LIQUID CRYSTAL DISPLAY (LCD)

(75) Inventors: Shih-Chung Wang, Hsin-Chu (TW); Yun-Hung Shen, Hsin-Chu (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 860 days.

(21) Appl. No.: 11/930,162

(22) Filed: Oct. 31, 2007

(65) Prior Publication Data

US 2008/0158269 A1 Jul. 3, 2008

(30) Foreign Application Priority Data

Dec. 28, 2006 (TW) ................................ 95149493 A

(51) Int. Cl.

| | |
|---|---|
| ***G09G 5/00*** | (2006.01) |
| ***G06T 17/00*** | (2006.01) |
| ***G06K 9/40*** | (2006.01) |
| ***G06K 9/46*** | (2006.01) |
| ***H04N 9/74*** | (2006.01) |
| ***H04N 1/46*** | (2006.01) |
| ***G02F 1/13*** | (2006.01) |
| *H03M 1/12* | (2006.01) |
| *G06K 9/32* | (2006.01) |
| *H04N 5/202* | (2006.01) |
| *H04N 5/74* | (2006.01) |

(52) U.S. Cl. ........ 345/596; 345/428; 345/649; 345/690; 345/204; 348/254; 348/751; 348/574; 348/583; 349/1; 382/237; 382/254; 382/274; 382/293; 358/534; 358/448; 358/1.9; 358/3.13

(58) Field of Classification Search .................. 348/245, 348/254, 251, 430, 441, 445, 459, 556, 571–574, 348/575, 583, 671, 683, 739, 751; 345/428, 345/581, 589, 596, 600, 605, 619, 649, 204, 345/690, 698–699, 63, 77, 87, 89, 601

See application file for complete search history.

(56) References Cited

U.S. PATENT DOCUMENTS

| | | | | |
|---|---|---|---|---|
| 4,524,447 | A * | 6/1985 | Willis et al. | 375/243 |
| 5,374,963 | A * | 12/1994 | Willis | 348/564 |
| 5,602,941 | A * | 2/1997 | Charles et al. | 382/251 |
| 7,483,039 | B1 * | 1/2009 | Alben et al. | 345/596 |
| 2001/0045957 | A1 | 11/2001 | Ulichney | |

(Continued)

FOREIGN PATENT DOCUMENTS

| | | |
|---|---|---|
| JP | 2005321442 | 11/2005 |

(Continued)

*Primary Examiner* — Wesner Sajous

(74) *Attorney, Agent, or Firm* — Winston Hsu; Scott Margo

(57) ABSTRACT

A dithering method includes: utilizing a plurality of large dithering masks to perform dithering on a first set of Least Significant Bits (LSBs) of M-bit video data, utilizing a plurality of small dithering masks to perform dithering on a second set of LSBs of the M-bit video data, and adjusting the content of at least one of the plurality of large dithering masks and/or the content of at least one of the plurality of small dithering masks on a frame-by-frame basis. Each of the plurality of large dithering masks includes a plurality of sub-dithering masks. Each of the plurality of sub-dithering masks includes a plurality of dithering thresholds. Each of the plurality of small dithering masks includes a plurality of dithering thresholds.

24 Claims, 4 Drawing Sheets

U.S. PATENT DOCUMENTS

| | | | | |
|---|---|---|---|---|
| 2003/0184508 | A1 | 10/2003 | Lee | |
| 2004/0125117 | A1 * | 7/2004 | Suzuki et al. | 345/690 |
| 2005/0219176 | A1 * | 10/2005 | Song | 345/87 |
| 2007/0030285 | A1 * | 2/2007 | Weitbruch et al. | 345/596 |

FOREIGN PATENT DOCUMENTS

| | | |
|---|---|---|
| TW | 528983 | 4/2003 |
| TW | 556931 | 10/2003 |

* cited by examiner

DITHERING METHOD AND RELATED DITHERING MODULE AND LIQUID CRYSTAL DISPLAY (LCD)

BACKGROUND OF THE INVENTION

1. Field of the Invention

The present invention relates to Liquid Crystal Display (LCD), and more particularly, to a dithering method applied in an LCD and a related dithering module and LCD.

2. Description of the Prior Art

Liquid Crystal Display (LCD) is one of the most important products on the current display market. A signal controller and a driving IC are two extremely important components in the LCD, wherein the signal controller receives R/G/B video signals and data enable signals DE, and generates corresponding control signals accordingly, and the driving IC drives a display panel according to the control signals generated by the signal controller.

In general, a bit number of the R/G/B video signals received by the signal controller is equal to a bit number that the driving IC is capable of processing. Taking the present popular video format for example, the bit number of the R/G/B video signals received by the signal controller is 8-bits, and thus the driving IC utilized in the LCD is capable of processing 8-bit signals. However, the unit price of a driving IC for processing 8-bit signals is more expensive than the unit price of a driving IC for processing 6-bit signals. In order to reduce the cost, some people in academic and industry fields provide dithering techniques for an LCD integrated with a driving IC for processing 6-bit signals that can display frames according to the 8-bit R/G/B video signals. However, all of the conventional dithering techniques have their own disadvantages. For example, some conventional dithering techniques will result in a problem of Gamma degeneracy; that is, each of the R/G/B color fields with original 256 gray levels will degenerate to R/G/B color fields with 253 gray levels. In this way, the input data has 256*256*256=16,777,216 color levels originally, but the LCD is only able to display 253*253*253=16,194,277 color levels, and a total number of about 580 thousands of color levels are missed. This is one of the problems faced by the conventional LCD dithering techniques.

SUMMARY OF THE INVENTION

It is therefore one of the objectives of the present invention to provide a dithering method applied in a Liquid Crystal Display (LCD) and a related dithering module and LCD.

According to an embodiment of the present invention, a method for dithering M-bit video data to generate N-bit video data is disclosed. The method comprises: utilizing a plurality of large dithering masks to perform dithering on a first set of least significant bits (LSBs) of the M-bit video data, wherein each large dithering mask comprises a plurality of sub-dithering masks, and each sub-dithering mask comprises a plurality of dithering thresholds; utilizing a plurality of small dithering masks to perform dithering on a second set of LSBs of the M-bit video data, wherein each small dithering mask comprises a plurality of dithering thresholds; and adjusting the content of at least one of the plurality of large dithering masks and/or the content of at least one of the plurality of small dithering masks on a frame-by-frame basis.

According to an embodiment of the present invention, a dithering module for dithering M-bit video data to generate N-bit video data is further disclosed. The dithering module comprises: a first dithering unit, for utilizing a plurality of large dithering masks to perform dithering on a first set of LSBs of the M-bit video data, wherein each large dithering mask comprises a plurality of sub-dithering masks, and each sub-dithering mask comprises a plurality of dithering thresholds; a second dithering unit, for utilizing a plurality of small dithering masks to perform dithering on a second set of LSBs of the M-bit video data, wherein each small dithering mask comprises a plurality of dithering thresholds; and a controlling unit, coupled to the first dithering unit and the second dithering unit, the controlling unit for adjusting the content of at least one of the plurality of large dithering masks and/or the content of at least one of the plurality of small dithering masks on a frame-by-frame basis.

According to an embodiment of the present invention, an LCD is yet further disclosed. The LCD comprises a display panel, a data processor, and a data driver. The data processor comprises: a mapping module, for mapping L-bit video data to be M-bit video data; and a dithering module, coupled to the mapping module, for dithering the M-bit video data to generate N-bit video data. The data driver is coupled to the display panel and the data processor, and utilized for driving the display panel according to the N-bit video data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
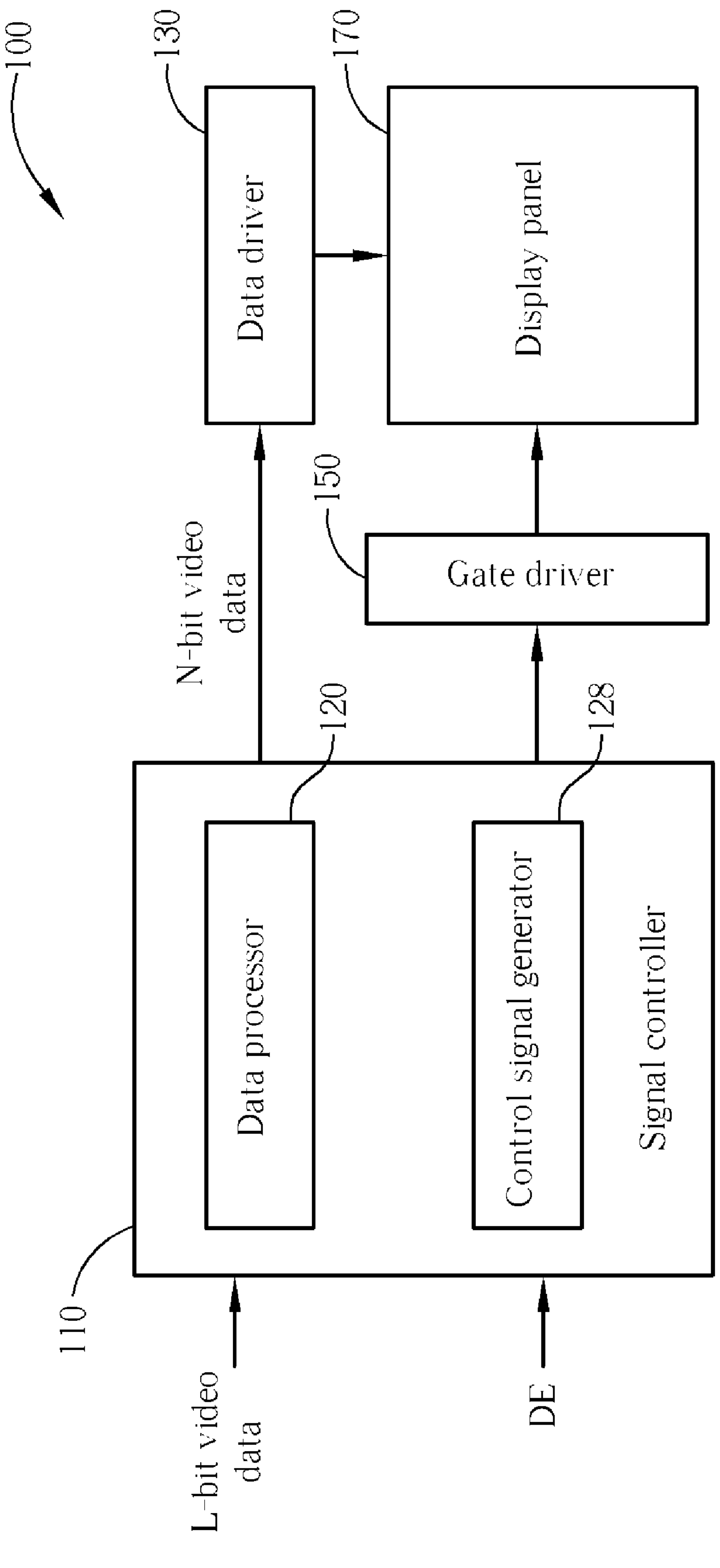
FIG. 1 shows a block diagram of a Liquid Crystal Display (LCD) according to an embodiment of the present invention.

Please refer to FIG. 1. FIG. 1 shows a block diagram of a Liquid Crystal Display (LCD) 100 according to an embodiment of the present invention. The LCD 100 of the embodiment includes a signal controller 110, a data driver 130, a gate driver 150, and a display panel 170. The signal controller 110 of the embodiment receives L-bit video data and data enable signal DE, and controls the operations of the data driver 130 and the gate driver 150 accordingly, and the signal controller 110 includes a data processor 120 and a control signal generator 128. The data driver 130 and the gate driver 150 drive the display panel 170 to display frame data according to the control of the signal controller 110. Since the data driver 130 of the embodiment is capable of processing N-bit video data, the data processor 120 has to generate N-bit video data according to the L-bit video data and utilize the N-bit video data to control the operation of the data driver 130.

Figure 2:
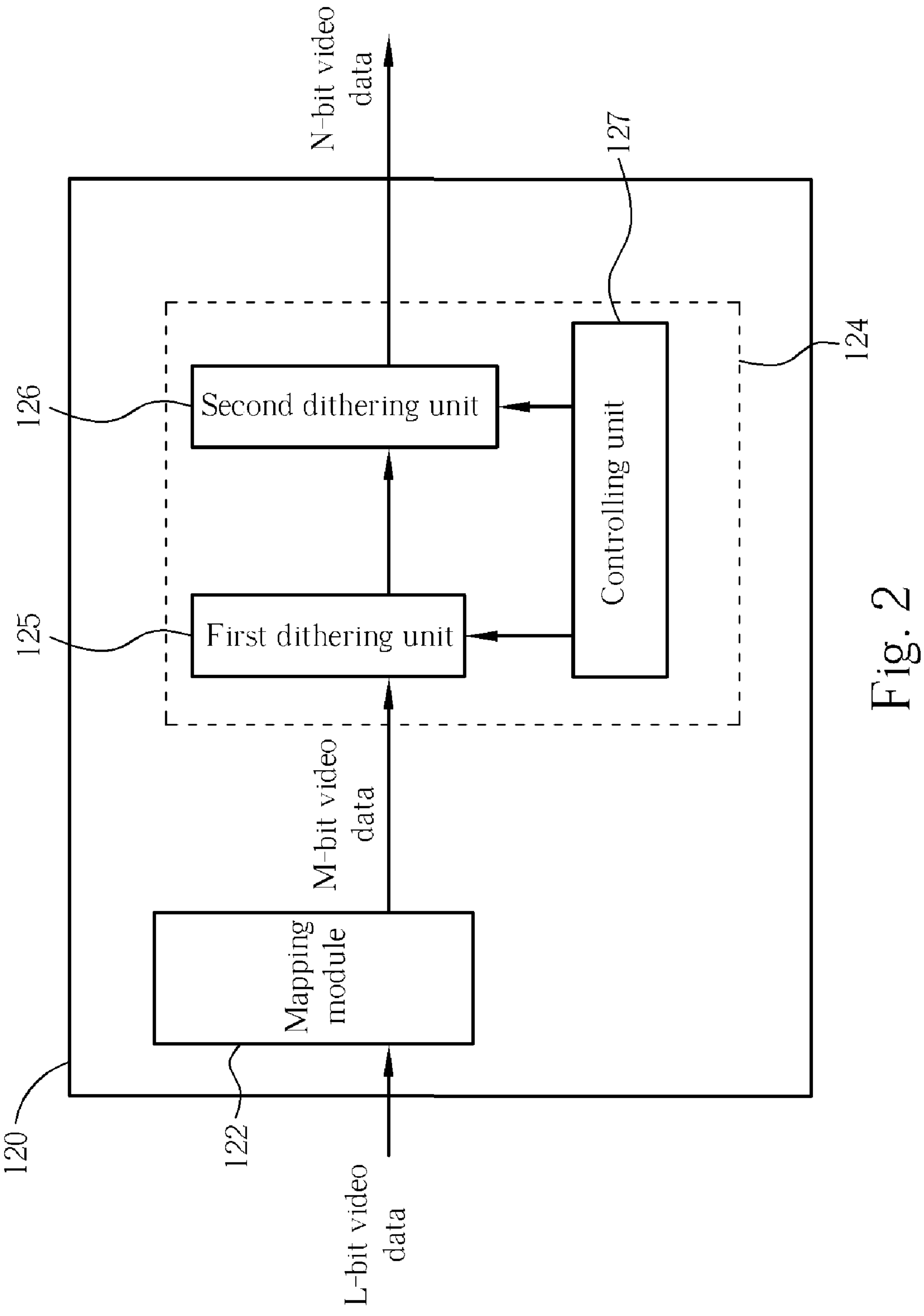
FIG. 2 shows a block diagram of the data processor shown in FIG. 1 according to an embodiment of the present invention.

Please refer to FIG. 2. FIG. 2 shows a block diagram of the data processor 120 shown in FIG. 1 according to an embodiment of the present invention. In this embodiment, the data processor 120 includes a mapping module 122 and a dithering module 124. The mapping module 122 is utilized for mapping the L-bit video data to be M-bit video data, and the dithering module 124 is utilized for dithering the M-bit video data to generate the N-bit video data. For example, M=L+2, N=M−4, and this document will take L=8, M=10, and N=6 as an example in the following paragraphs.

The mapping module 122 can include a mapping table of mapping the 8-bit video data to be 10-bit video data therein for the mapping module 122 to operate accordingly. In order to prevent the LCD 100 of the embodiment from facing the problem of Gamma degeneracy, the mapping module 122 can limit all the front 6 bits of each 10-bit pixel data in the 10-bit video data to not be 1. In other words, the mapping module 122 can limit each 10-bit pixel data in the 10-bit video data to be larger than or equal to '0000000000', and smaller than '1111110000' (represented in the binary system mode).

In this embodiment, the dithering module 124 includes a first dithering unit 125, a second dithering unit 126, and a controlling unit 127. The first dithering unit 125 utilizes a plurality of large dithering masks to perform the dithering operations on a first set of least significant bits (LSBs) of the 10-bit video data. For example, the first set of LSBs can include a first LSB and a second LSB of the 10-bit video data, wherein each of the plurality of large dithering masks includes four sub-dithering masks, and each of the four sub-dithering masks includes four dithering thresholds. The second dithering unit 126 utilizes a plurality of small dithering masks to perform the dithering operations on a second set of LSBs of the 10-bit video data. For example, the second set of LSBs can include a third LSB and a fourth LSB of the 10-bit video data, wherein each of the plurality of small dithering masks includes four dithering thresholds.

Figure 3:
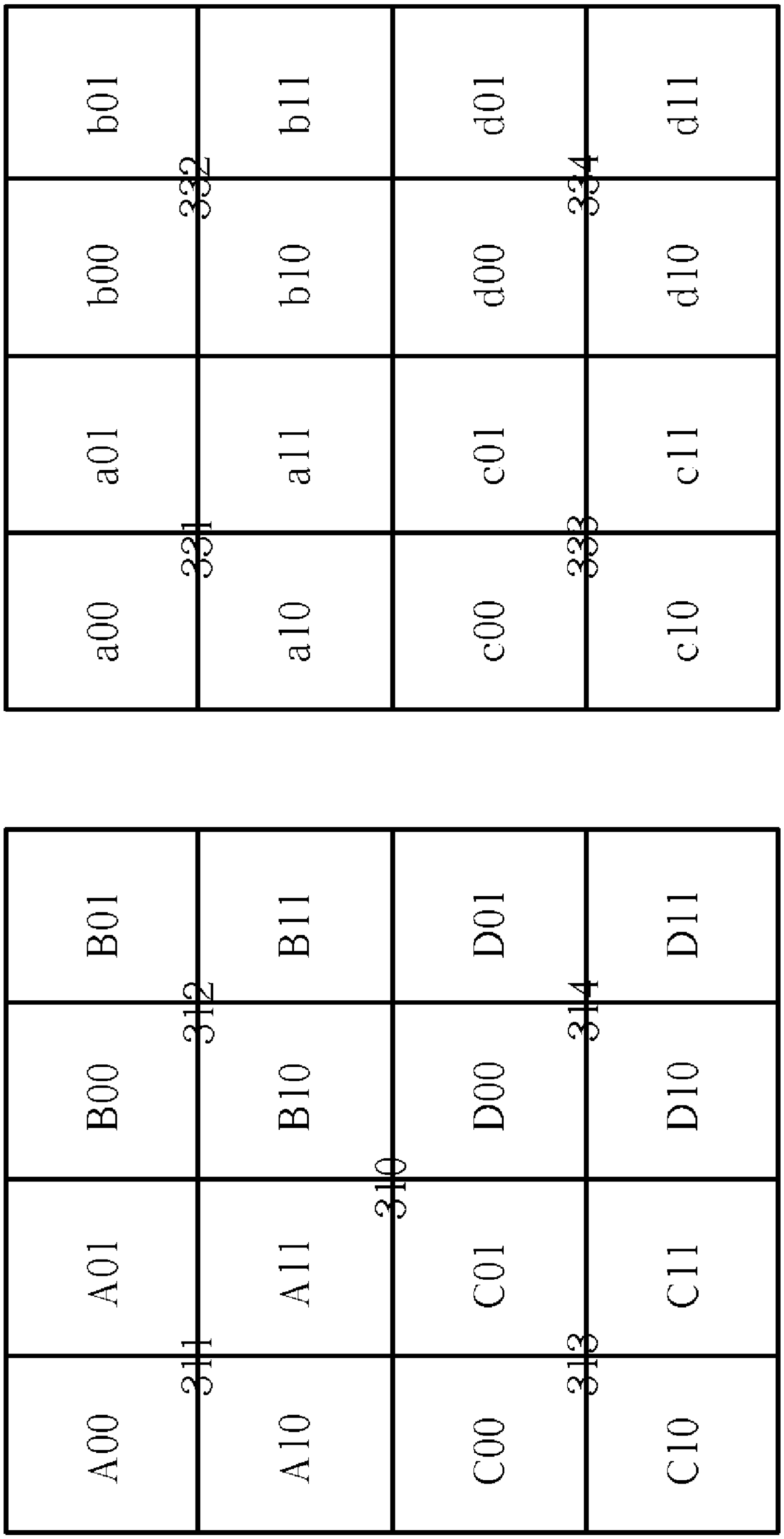
FIG. 3 shows a diagram of large dithering masks and small dithering masks utilized by the first dithering unit and the second dithering unit shown in FIG. 2.

Please refer to FIG. 3. FIG. 3 shows a diagram of the large dithering masks and the small dithering masks mentioned above, wherein 310 is a large dithering mask, 311, 312, 313, and 314 are four sub-dithering masks, and each of the four sub-dithering masks includes four dithering thresholds. More specifically, A00, A01, A10, and A11 are the four dithering thresholds in the sub-dithering mask 311, and the binary values of the four dithering thresholds can be determined by utilizing the controlling unit 127, in order to let one of the four dithering thresholds be equal to '00', one of the four dithering thresholds be equal to '01', one of the four dithering thresholds be equal to '10', one of the four dithering thresholds be equal to '11'; . . . ; by analogy, D00, D01, D10, and D11 are the four dithering thresholds in the sub-dithering mask 314, and the binary values of the four dithering thresholds can be determined by utilizing the controlling unit 127, in order to let one of the four dithering thresholds be equal to '00', one of the four dithering thresholds be equal to '01', one of the four dithering thresholds be equal to '10', and one of the four dithering thresholds be equal to '11'. When the resolution of the 10-bit video data is 1024 pixels*768 pixels, the first dithering unit 125 has to utilize 256*192 large dithering masks to perform the dithering operations on the first LSB and the second LSB of the 10-bit video data. For example, assuming A is equal to '10', then for a pixel Pin corresponding to A11 of the 10-bit video data, the first dithering unit 125 can add '10' into the pixel Pin in order to generate an output pixel Pin'. Of course, the first dithering unit 125 can also compare '01' with last two bits 'xy' of the pixel Pin, and if 'xy' is larger than '01', then the first dithering unit 125 will add '100' into the pixel Pin in order to generate the output pixel Pin' (i.e. carry a number at the third LSB of the pixel Pin in order to generate the output pixel Pin'); if 'xy' is smaller than or equal to '01', then the first dithering unit 125 will use the pixel Pin as the output pixel Pin' (i.e. will not carry a number).

In addition, 331, 332, 333, and 334 are four small dithering masks in FIG. 3. a00, a01, a10, and a11 are the four dithering thresholds in the small dithering mask 331, and the binary values of the four dithering thresholds can be determined by utilizing the controlling unit 127, in order to let one of the four dithering thresholds be equal to '00', one of the four dithering thresholds be equal to '01' one of the four dithering thresholds be equal to '10', one of the four dithering thresholds be equal to '11'; . . . ; by analogy, d00, d01, d10, and d11 are the four dithering thresholds in the small dithering mask 334, and the binary values of the four dithering thresholds can be determined by utilizing the controlling unit 127, in order to let one of the four dithering thresholds be equal to '00', one of the four dithering thresholds be equal to '01', one of the four dithering thresholds be equal to '10', and one of the four dithering thresholds be equal to '11'. When the resolution of the 10-bit video data is 1024 pixels*768 pixels, the second dithering unit 126 has to utilize 512*384 small dithering masks to perform the dithering operations on the third LSB and the fourth LSB of the 10-bit video data. For example, assuming a11 is equal to '10', then for the pixel Pin' corresponding to al outputted by the first dithering unit 125, the second dithering unit 126 can add '0100' into the pixel Pin' in order to generate an output pixel Pout. Of course, the second dithering unit 126 can also compare '10' with the third bit and the fourth bit counted from the end 'pq' of the pixel Pin, and if 'pq' is larger than '10', then the second dithering unit 126 will add '10000' into the pixel Pin' in order to generate the output pixel Pout (i.e. carry a number at the fifth LSB of the pixel Pin in order to generate the output pixel Pout); if 'pq' is smaller than or equal to '10', then the second dithering unit 126 will use the pixel Pin' as the output pixel Pout (i.e. will not carry a number). In the last, the second dithering unit 126 outputs the front 6 most significant bits (MSBs) of each pixel data after dithered as the 6-bit video data.

Figure 4:
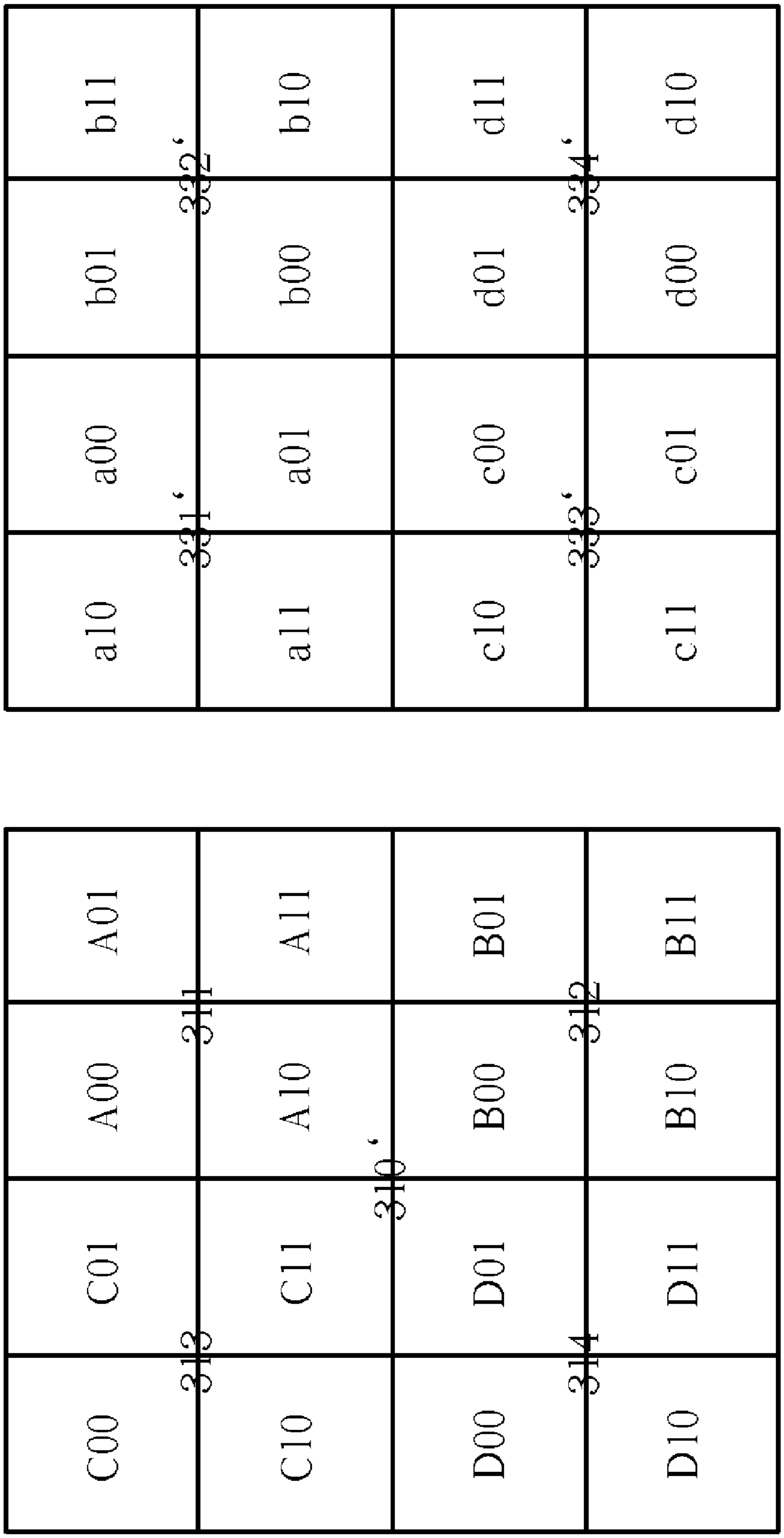
FIG. 4 shows an example of the operation performed by the controlling unit shown in FIG. 2.

Please refer to FIG. 4. FIG. 4 shows an example of the operation performed by the controlling unit 127. In order to provide dithering effects in a time domain, the controlling unit 127 adjusts the content of at least one of the plurality of large dithering masks on a frame-by-frame basis. Taking the large dithering mask 310 shown in FIG. 3 as an example, the controlling unit 127 can rotate the positions of the four sub-dithering masks 311, 312, 313, and 314 by 90 degrees (or 180 degrees, or 270 degrees) clockwise (or counterclockwise) every other frame without changing the contents of the four sub-dithering masks 311, 312, 313, and 314. Shown in the left side of FIG. 4 is an example of rotating the positions of the four sub-dithering masks 311, 312, 313, and 314 by 90 degrees clockwise.

Similarly, in order to provide the dithering effects on the time domain, the controlling unit 127 adjusts the content of at least one of the plurality of small dithering masks on a frame-by-frame basis. Taking the small dithering masks 331, 332, 333, and 334 shown in FIG. 3 as an example, the controlling unit 127 can rotate the dithering thresholds of the four small dithering masks 331, 332, 333, and 334 by 90 degrees (or 180 degrees, or 270 degrees) clockwise (or counterclockwise) every other frame without changing the positions of the four small dithering masks 331, 332, 333, and 334. Shown in the right side of FIG. 4 is an example of rotating the dithering thresholds of the four small dithering masks 331 and 333 by 90 degrees clockwise and rotating the dithering thresholds of the four small dithering masks 332 and 334 by 90 degrees counterclockwise.

The controlling unit 127 can count as a programming unit in the dithering module 124. The controlling unit 127 is able to adaptively set the dithering thresholds of the first dithering unit 125 and/or the second dithering unit 126. In addition, the controlling unit 127 is also able to adaptively determine a rotating direction of rotating the sub-dithering masks of each large dithering mask and/or a rotating direction of the dithering thresholds of each small dithering mask according to the operation requirement of the LCD 100. For example, the polarity control scheme adopted by the LCD 100 can be a reference for the controlling unit 127 during the operation.

Although the data driver 130 of the LCD 100 in this embodiment is only capable of processing the 6-bit video data, the LCD 100 can present the effect of the 8-bit video data by the operations performed by the data processor 120. In addition, the dithering techniques adopted in this embodiment will not result in the Gamma degeneracy problem, and therefore the LCD 100 can display all of the color levels included by the 8-bit video data correctly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for dithering M-bit video data to generate N-bit video data, the method comprising:

utilizing a plurality of large dithering masks by a first dithering unit to perform dithering on a first set of least significant bits (LSBs) of the M-bit video data, wherein each of the plurality of large dithering masks comprises a plurality of sub-dithering masks, and each of the plurality of sub-dithering masks comprises a plurality of dithering thresholds;

utilizing a plurality of small dithering masks by a second dithering unit to perform dithering on a second set of LSBs of the M-bit video data, wherein each of the plurality of small dithering masks comprises a plurality of dithering thresholds; and adjusting the content of at least one of the plurality of large dithering masks and/or the content of at least one of the plurality of small dithering masks on a frame-by-frame basis;

wherein N and M are positive integers.

2. The method of claim 1, wherein the step of adjusting the content of at least one of the plurality of large dithering masks and/or the content of at least one of the plurality of small dithering masks on a frame-by-frame basis further comprises:

rotating at least one of the plurality of large dithering masks on a frame-by-frame basis; and/or rotating at least one of the plurality of small dithering masks on a frame-by-frame basis.

3. The method of claim 2, further comprising:

adaptively determining a rotating direction of rotating at least one of the plurality of large dithering masks and/or a rotating direction of rotating at least one of the plurality of small dithering masks.

4. The method of claim 2, further comprising:

determining a rotating direction of rotating at least one of the plurality of large dithering masks and/or a rotating direction of rotating at least one of the plurality of small dithering masks according to a polarity control scheme utilized when displaying the N-bit video data.

5. The method of claim 1, further comprising:

adaptively setting the dithering thresholds of the plurality of large dithering masks and/or the dithering thresholds of the plurality of small dithering masks.

6. The method of claim 1, wherein the first set of LSBs comprises a first LSB and a second LSB of the M-bit video data, and the second set of LSBs comprises a third LSB and a fourth LSB of the M-bit video data.

7. The method of claim 1, wherein each of the plurality of large dithering masks comprises four sub-dithering masks, each of the plurality of sub-dithering masks comprises four dithering thresholds, and each of the plurality of small dithering masks comprises four dithering thresholds.

8. The method of claim 1, further comprising:

mapping L-bit video data to be the M-bit video data, wherein L is a positive integer.

9. The method of claim 8, wherein L is equal to 8, M is equal to 10, and N is equal to 6.

10. A dithering module, for dithering M-bit video data to generate N-bit video data, the dithering module comprising:

a first dithering unit, for utilizing a plurality of large dithering masks to perform dithering on a first set of LSBs of the M-bit video data, wherein each of the plurality of large dithering masks comprises a plurality of sub-dithering masks, and each of the plurality of sub-dithering masks comprises a plurality of dithering thresholds;

a second dithering unit, for utilizing a plurality of small dithering masks to perform dithering on a second set of LSBs of the M-bit video data, wherein each of the plurality of small dithering masks comprises a plurality of dithering thresholds; and a controlling unit, coupled to the first dithering unit and the second dithering unit, the controlling unit for adjusting the content of at least one of the plurality of large dithering masks and/or the content of at least one of the plurality of small dithering masks on a frame-by-frame basis;

wherein N and M are positive integers.

11. The method of claim 10, wherein the controlling unit rotates at least one of the plurality of large dithering masks on a frame-by-frame basis and/or rotates at least one of the plurality of small dithering masks on a frame-by-frame basis.

12. The dithering module of claim 11, wherein the controlling unit adaptively determines a rotating direction of rotating at least one of the plurality of large dithering masks and/or a rotating direction of rotating at least one of the plurality of small dithering masks.

13. The dithering module of claim 11, wherein the controlling unit determines a rotating direction of rotating at least one of the plurality of large dithering masks and/or a rotating direction of rotating at least one of the plurality of small dithering masks according to a polarity control scheme utilized when displaying the N-bit video data.

14. The dithering module of claim 10, wherein the controlling unit adaptively sets the dithering thresholds of the plurality of large dithering masks and/or the dithering thresholds of the plurality of small dithering masks.

15. The dithering module of claim 10, wherein the first set of LSBs comprises a first LSB and a second LSB of the M-bit video data, and the second set of LSBs comprises a third LSB and a fourth LSB of the M-bit video data.

16. The dithering module of claim 10, wherein M is equal to 10, and N is equal to 6.

17. A liquid crystal display, comprising:

a display panel;

a data processor, comprising:

a mapping module, for mapping L-bit video data to be M-bit video data; and a dithering module, coupled to the mapping module, for dithering the M-bit video data to generate N-bit video data; and a data driver, coupled to the display panel and the data processor, for driving the display panel according to the N-bit video data;

wherein the dithering module comprises:

a first dithering unit, for utilizing a plurality of large dithering masks to perform dithering on a first set of LSBs of the M-bit video data, wherein each of the plurality of large dithering masks comprises a plurality of sub-dithering masks, and each of the plurality of sub-dithering masks comprises a plurality of dithering thresholds; and a second dithering unit, for utilizing a plurality of small dithering masks to perform dithering on a second set of LSBs of the M-bit video data, wherein each of the plurality of small dithering masks comprises a plurality of dithering thresholds;

wherein L, N, and M are positive integers.

18. The liquid crystal display of claim 17, wherein L is equal to 8, M is equal to 10, and N is equal to 6.

19. The liquid crystal display of claim 17, wherein the dithering module further comprises:

a controlling unit, coupled to the first dithering unit and the second dithering unit, the controlling unit adjusting the content of at least one of the plurality of large dithering masks and/or the content of at least one of the plurality of small dithering masks on a frame-by-frame basis.

20. The liquid crystal display of claim 19, wherein the controlling unit rotates at least one of the plurality of large dithering masks on a frame-by-frame basis and/or rotates at least one of the plurality of small dithering masks on a frame-by-frame basis.

21. The liquid crystal display of claim 20, wherein the controlling unit adaptively determines a rotating direction of rotating at least one of the plurality of large dithering masks and/or a rotating direction of rotating at least one of the plurality of small dithering masks.

22. The liquid crystal display of claim 20, wherein the controlling unit determines a rotating direction of rotating at least one of the plurality of large dithering masks and/or a rotating direction of rotating at least one of the plurality of small dithering masks according to a polarity control scheme utilized when displaying the N-bit video data.

23. The liquid crystal display of claim 19, wherein the controlling unit adaptively sets the dithering thresholds of the plurality of large dithering masks and/or the dithering thresholds of the plurality of small dithering masks.

24. The liquid crystal display of claim 17, wherein the first set of LSBs comprises a first LSB and a second LSB of the M-bit video data, and the second set of LSBs comprises a third LSB and a fourth LSB of the M-bit video data.

* * * * *